(12) United States Patent
Coons et al.

(10) Patent No.: US 7,545,880 B1
(45) Date of Patent: Jun. 9, 2009

(54) MULTIPLE POLYNOMIAL DIGITAL PREDISTORTION

(75) Inventors: David Coons, Greensboro, NC (US); Brian Baxter, High Point, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 11/847,044

(22) Filed: Aug. 29, 2007

Related U.S. Application Data

(62) Division of application No. 10/874,509, filed on Jun. 23, 2004.

(51) Int. Cl.
*H04K 1/02* (2006.01)
(52) U.S. Cl. .................... 375/296; 375/297; 330/149
(58) Field of Classification Search ............ 375/296, 375/297, 300, 269; 455/63.1, 126, 114.1, 455/239.1, 341; 330/149
See application file for complete search history.

(56) References Cited

U.S. PATENT DOCUMENTS

| | | | |
|---|---|---|---|
| 3,900,823 | A | 8/1975 | Sokal et al. |
| 4,609,881 | A | 9/1986 | Wells |
| 4,837,786 | A | 6/1989 | Gurantz et al. |
| 5,055,802 | A | 10/1991 | Hietala et al. |
| 5,079,522 | A | 1/1992 | Owen et al. |
| 5,313,411 | A | 5/1994 | Tsujimoto |
| 5,430,416 | A | 7/1995 | Black et al. |
| 5,444,415 | A | 8/1995 | Dent et al. |
| 5,598,436 | A | 1/1997 | Brajal et al. |
| 5,608,353 | A | 3/1997 | Pratt |
| 5,629,648 | A | 5/1997 | Pratt |
| 5,822,011 | A | 10/1998 | Rumreich |
| 5,900,778 | A | 5/1999 | Stonick et al. |
| 5,952,895 | A | 9/1999 | McCune, Jr. et al. |
| 6,008,703 | A | 12/1999 | Perrott et al. |
| 6,101,224 | A | 8/2000 | Lindoff et al. |
| 6,130,579 | A | 10/2000 | Iyer et al. |
| 6,141,390 | A | 10/2000 | Cova |
| 6,191,656 | B1 | 2/2001 | Nadler |

(Continued)

OTHER PUBLICATIONS

Andraka, Ray, "A Survey of CORDIC Algorithms for FPGA Based Computers," Association for Computing Machinery, 0-89791-978-5, 1998.

(Continued)

*Primary Examiner*—David C Payne
*Assistant Examiner*—Rahel Guarino
(74) *Attorney, Agent, or Firm*—Winthrow & Terranova, P.L.L.C.

(57) ABSTRACT

A system is provided for pre-distorting a transmit signal in a mobile terminal prior to amplification by a power amplifier to compensate for AM to AM and AM to PM distortion over an input value range. Pre-distortion circuitry includes both amplitude and phase pre-distortion circuitries. The amplitude pre-distortion circuitry distorts an amplitude component of a polar transmit signal using an amplitude compensation signal that essentially cancels the AM to AM distortion, and the phase pre-distortion circuitry distorts a phase component of the polar transmit signal using a phase compensation signal that essentially cancels the AM to PM distortion. The amplitude and phase compensation signals are generated based on corresponding sets of coefficients selected from a number of sets of coefficients defining polynomials describing compensation signals for each of at least two subsets of the input value range for each of two or more power levels of the power amplifier circuitry.

20 Claims, 4 Drawing Sheets

U.S. PATENT DOCUMENTS

| | | | |
|---|---|---|---|
| 6,211,747 B1 | 4/2001 | Trichet et al. | |
| 6,229,395 B1 | 5/2001 | Kay | |
| 6,236,687 B1 | 5/2001 | Caso et al. | |
| 6,236,703 B1 | 5/2001 | Riley | |
| 6,240,278 B1 | 5/2001 | Midya et al. | |
| 6,246,286 B1 | 6/2001 | Persson | |
| 6,271,727 B1 | 8/2001 | Schmukler | |
| 6,275,685 B1 | 8/2001 | Wessel et al. | |
| 6,285,239 B1 | 9/2001 | Iyer et al. | |
| 6,288,610 B1 | 9/2001 | Miyashita | |
| 6,295,442 B1 | 9/2001 | Camp, Jr. et al. | |
| RE37,407 E | 10/2001 | Eisenberg et al. | |
| 6,307,364 B1 | 10/2001 | Augustine | |
| 6,329,809 B1 | 12/2001 | Dening et al. | |
| 6,335,767 B1 | 1/2002 | Twitchell et al. | |
| 6,356,150 B1 | 3/2002 | Spears et al. | |
| 6,359,950 B2 | 3/2002 | Gossmann et al. | |
| 6,366,177 B1 | 4/2002 | McCune et al. | |
| 6,377,784 B2 | 4/2002 | McCune | |
| 6,392,487 B1 | 5/2002 | Alexanian | |
| 6,417,731 B1 | 7/2002 | Funada et al. | |
| 6,489,846 B2 | 12/2002 | Hatsugai | |
| 6,504,885 B1 | 1/2003 | Chen | |
| 6,522,121 B2 | 2/2003 | Coumou | |
| 6,581,082 B1 | 6/2003 | Opsahl | |
| 6,587,514 B1 | 7/2003 | Wright et al. | |
| 6,642,786 B1 * | 11/2003 | Jin et al. | 330/149 |
| 6,693,468 B2 | 2/2004 | Humphreys et al. | |
| 6,700,929 B1 | 3/2004 | Shan et al. | |
| 6,701,134 B1 | 3/2004 | Epperson | |
| 6,701,138 B2 | 3/2004 | Epperson et al. | |
| 6,720,831 B2 | 4/2004 | Dening et al. | |
| 6,724,252 B2 | 4/2004 | Ngo et al. | |
| 6,724,265 B2 | 4/2004 | Humphreys | |
| 6,724,831 B1 | 4/2004 | Hasegawa et al. | |
| 6,728,324 B1 | 4/2004 | Shan et al. | |
| 6,731,145 B1 | 5/2004 | Humphreys et al. | |
| 6,748,204 B1 | 6/2004 | Razavi et al. | |
| 6,782,244 B2 | 8/2004 | Steel et al. | |
| 6,798,843 B1 | 9/2004 | Wright et al. | |
| 6,801,086 B1 * | 10/2004 | Chandrasekaran | 330/140 |
| 6,807,406 B1 | 10/2004 | Razavi et al. | |
| 6,816,718 B2 | 11/2004 | Yan et al. | |
| 6,819,914 B2 | 11/2004 | Yan et al. | |
| 6,819,941 B2 | 11/2004 | Dening et al. | |
| 6,831,506 B1 | 12/2004 | Moffat et al. | |
| 6,834,084 B2 | 12/2004 | Hietala | |
| 6,836,517 B2 | 12/2004 | Nagatani et al. | |
| 6,900,778 B1 | 5/2005 | Yamamoto | |
| 6,914,943 B2 | 7/2005 | Shimizu | |
| 6,975,688 B2 | 12/2005 | Rexberg et al. | |
| 7,010,276 B2 | 3/2006 | Sander et al. | |
| 7,054,385 B2 | 5/2006 | Booth et al. | |
| 7,109,791 B1 | 9/2006 | Epperson et al. | |
| 7,113,036 B2 * | 9/2006 | Moffatt et al. | 330/149 |
| 7,158,494 B2 | 1/2007 | Sander et al. | |
| 7,349,490 B2 | 3/2008 | Hunton | |
| 7,457,586 B1 | 11/2008 | Hietala et al. | |
| 2001/0033238 A1 | 10/2001 | Velazquez | |
| 2002/0008578 A1 | 1/2002 | Wright et al. | |
| 2002/0041210 A1 | 4/2002 | Booth et al. | |
| 2002/0060606 A1 | 5/2002 | Andre | |
| 2002/0093378 A1 | 7/2002 | Nielsen et al. | |
| 2002/0160821 A1 | 10/2002 | Kaikati et al. | |
| 2003/0012289 A1 | 1/2003 | Lindoff | |
| 2003/0133518 A1 | 7/2003 | Koomullil et al. | |
| 2003/0179830 A1 | 9/2003 | Eidson et al. | |
| 2003/0197558 A1 | 10/2003 | Bauder et al. | |
| 2003/0215025 A1 | 11/2003 | Hietala | |
| 2003/0215026 A1 | 11/2003 | Hietala | |
| 2003/0227342 A1 | 12/2003 | Liu | |
| 2004/0072597 A1 | 4/2004 | Epperson et al. | |
| 2004/0183511 A1 | 9/2004 | Dening | |
| 2004/0198414 A1 | 10/2004 | Hunton | |
| 2004/0208157 A1 | 10/2004 | Sander et al. | |
| 2005/0002470 A1 * | 1/2005 | Saed et al. | 375/296 |
| 2005/0195919 A1 | 9/2005 | Cova | |
| 2006/0071711 A1 | 4/2006 | Persson et al. | |

OTHER PUBLICATIONS

Johnson, Jackie, "Power Amplifier Design for Open Loop Edge Large Signal Polar Modulation Systems," RFDesign, Jun. 2006, pp. 42-50.

Pinto et al., "Phase Distortion and Error Vector Magnitude for 8-PSK Systems," London Communications Symposium, Sep. 14-15, 2000, University College London, England.

Volder, Jack E., "The CORDIC Trigonometric Computing Technique," IRE Trans. On Elect. Computers p. 330, Sep. 1959.

* cited by examiner

MULTIPLE POLYNOMIAL DIGITAL PREDISTORTION

This application is a Divisional of U.S. utility patent application Ser. No. 10/874,509, filed Jun. 23, 2004, currently pending, the disclosure of which is incorporated herein by reference in its entirety.

FIELD OF THE INVENTION

The present invention relates to pre-distortion of a transmit signal to compensate for amplitude and phase distortion characteristics of a power amplifier.

BACKGROUND OF THE INVENTION

Transmitters form a significant portion of most communication circuits. As such, they assume a position of prominence in design concerns. With the proliferation of mobile terminals, transmitter design has progressed in leaps and bounds as designers try to minimize components and reduce size, power consumption, and the like. Likewise, modulation schemes are continuously updated to reflect new approaches to maximize information transfers within limited bandwidth constraints. Changes in standards or standards based on newly available spectrum may also cause designers to approach the design of transmission systems with different modulation techniques.

Many different standards and modulation schemes exist, but one of the most prevalently used in the world of mobile terminals is the Global System for Mobile Communications (GSM). GSM comes in many flavors, not the least of which is General Packet Radio Service (GPRS). GPRS is a new non-voice value-added service that allows information to be sent and received across a mobile telephone network. It supplements today's Circuit Switched Data and Short Message Service. GSM allows many different types of mobile terminals, such as cellular phones, pagers, wireless modem adapted laptops, and the like, to communicate wirelessly through the Public Land Mobile Network (PLMN) to the Public Switched Telephone Network (PSTN).

One relatively recent change has been the advent of the Enhanced Data for GSM Evolution (EDGE) scheme in GSM systems. This system contains amplitude modulation components, and, as a result, the power amplifier must be linear and should not operate in saturation when classical modulation techniques are employed. Such a linear system lacks the efficiency of one that operates the power amplifier in saturation.

If a polar modulation system is used instead of a classical modulation system, then the power amplifier may operate in saturation and efficiency would be greatly improved. In addition, if the polar signals are generated by a digital method, such a system does not require the use of a high current drain quadrature modulator. Quadrature modulators are undesirable from a design standpoint in that they draw large amounts of current, and hence, drain batteries comparatively fast.

Unfortunately, further complicating matters, the amplitude signal that controls the power amplifier will cause unwanted phase components to be created in the output of the power amplifier due to the non-linearities of the power amplifier. This is sometimes called amplitude to phase (AM to PM) distortion, and it degrades the spectral purity of the system and the Error Vector Magnitude. Thus, a need also exists to be able to counteract or eliminate the unwanted AM to PM distortion of the transmitted phase signal.

An additional concern is that the power amplifier may have a non-linear gain with varying output power. This may create what is called amplitude to amplitude (AM to AM) distortion. The AM to AM distortion may have both phase and amplitude distortion components, and to create a better control system, these should be reduced or eliminated as well.

One solution used to counteract AM to AM and AM to PM distortion is to measure the AM to AM and AM to PM distortion of the power amplifier, and then create a polynomial for amplitude pre-distortion and a polynomial for phase pre-distortion that are used to distort a signal prior to amplification by the power amplifier. This pre-distortion offsets the AM to AM and AM to PM distortion of the power amplifier. However, the polynomials are often at least third order polynomials and are costly to implement. Further, the polynomials may not effectively offset the AM to AM and AM to PM distortion of the power amplifier at every power level of the power amplifier. Thus, there remains a need for a more cost effective system for correcting AM to AM and AM to PM distortion of a power amplifier at every power level of the power amplifier.

SUMMARY OF THE INVENTION

The present invention provides a system and method for pre-distorting a transmit signal in a mobile terminal prior to amplification by a power amplifier to compensate for AM to AM and AM to PM distortion caused by the power amplifier. In general, the system includes pre-distortion circuitry having both amplitude pre-distortion circuitry and phase pre-distortion circuitry. The amplitude pre-distortion circuitry distorts an amplitude component of a polar transmit signal using an amplitude compensation signal that essentially cancels the AM to AM distortion of the power amplifier. The phase pre-distortion circuitry distorts a phase component of the polar transmit signal using a phase compensation signal that essentially cancels the AM to PM distortion of the power amplifier.

The amplitude pre-distortion circuitry generates the amplitude compensation signal based on a first set of coefficients selected from a first number of sets of coefficients. Each set of coefficients defines a polynomial describing the amplitude compensation signal for one of at least two subsets of an input value range of the power amplifier circuitry for one of at least two power levels of the power amplifier circuitry. Based on a transmit power control signal, a group of the first number of sets of coefficients are selected. The group of sets of coefficients define the polynomials describing the amplitude compensation signal for the subsets of the input value range for a power level indicated by the transmit power control signal. The first set of coefficients are selected from the group of the first number of coefficients based on the amplitude component of the polar transmit signal, where the amplitude component is indicative of the subset of the input value range.

The phase pre-distortion circuitry generates the phase compensation signal based on a second set of coefficients selected from a second number of sets of coefficients. Each of these sets of coefficients defines a polynomial describing the phase compensation signal for one of the at least two subsets of the input value range for one of the two or more power levels of the power amplifier circuitry. Based on the transmit power control signal, a group of the second number of sets of coefficients are selected. The group of sets of coefficients define the polynomials describing the phase compensation signal for the subsets of the input value range for the power level indicated by the transmit power control signal. The second set of coefficients are selected from the group of the second number of coefficients based on the amplitude component of the polar transmit signal, where the amplitude component is indicative of the subset of the input value range.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

While the present invention is particularly well-suited for use in a mobile terminal, and particularly a mobile terminal that is operating in an Enhanced Data for GSM Evolution (EDGE) scheme in a GSM system, it should be appreciated that the present invention may be used in other transmitters, either wireless or wirebased, as needed or desired.

Figure 1:
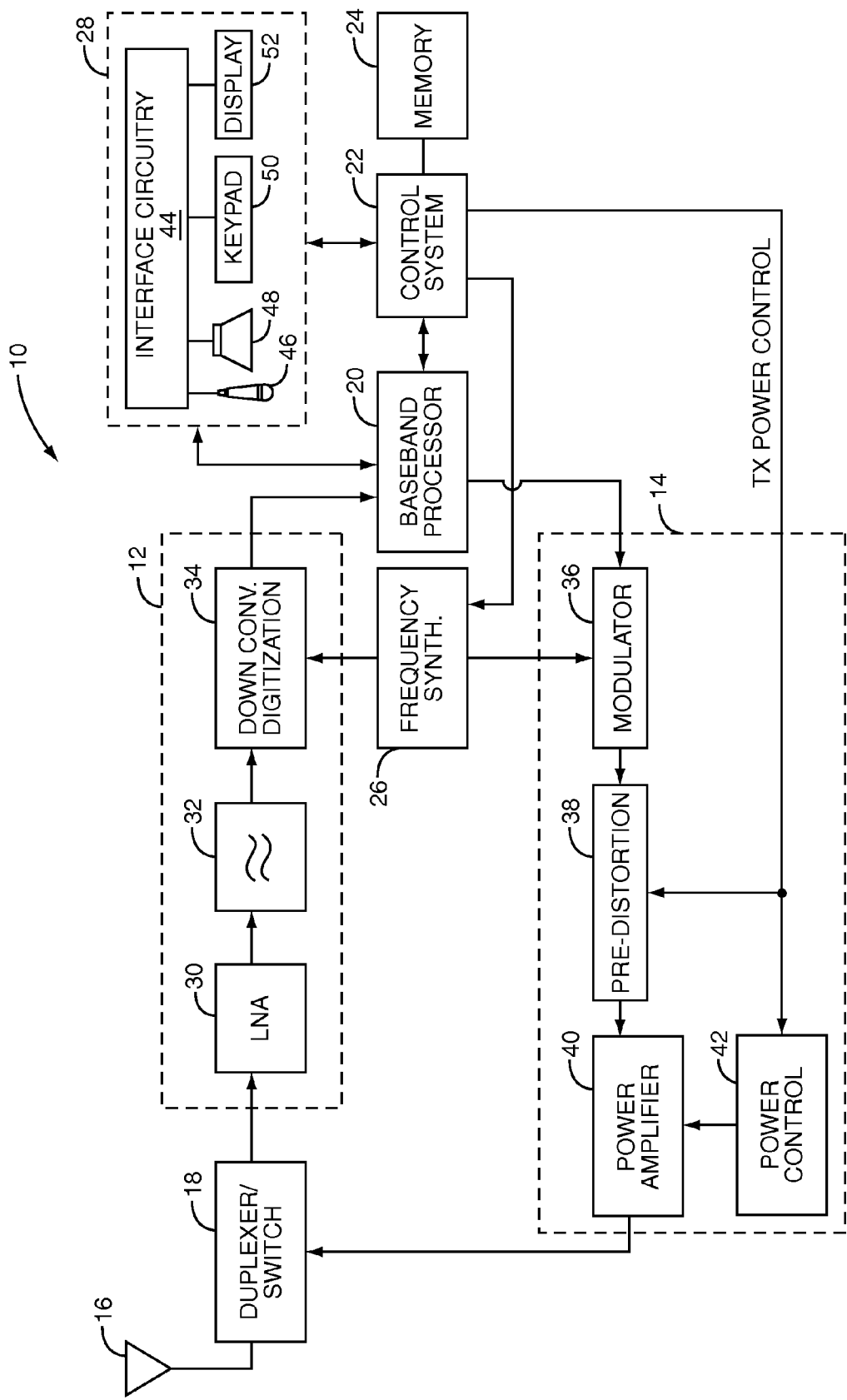
FIG. 1 illustrates a mobile terminal including pre-distortion circuitry according to one embodiment of the present invention.

The present invention is preferably incorporated in a mobile terminal 10, such as a mobile telephone, personal digital assistant, or the like. The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station (not shown). A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The encoded data is output to the radio frequency transmitter section 14, where it is used by a modulator 36 to modulate a carrier signal that is at a desired transmit frequency. As described below in detail, the output of the modulator 36 is pre-distorted by pre-distortion circuitry 38 to substantially cancel AM to AM and AM to PM distortion that occurs when the modulated carrier signal is amplified by power amplifier circuitry 40. The power amplifier circuitry 40 amplifies the pre-distorted modulated carrier signal to a level appropriate for transmission from the antenna 16.

The power amplifier circuitry 40 provides gain for the signal to be transmitted under control of the power control circuitry 42, which is preferably controlled by the control system 22. In essence, the power control circuitry 42 operates to control a supply voltage provided to the power amplifier circuitry 40 based on a transmit power control signal (TX POWER CONTROL) from the control system 22. The memory 24 may contain software that allows many of these functions to be run. Alternatively, these may be a function of sequential logic structures as is well understood. In another embodiment, the supply voltage provided to the power amplifier circuitry 40 may be provided based on an amplitude component of a pre-distorted polar transmit signal from the pre-distortion circuitry 38. In yet another embodiment, the amplitude component of the pre-distorted polar transmit signal may be provided to the power control circuitry 42 and combined with the transmit power control signal (TX POWER CONTROL) to control the supply voltage provided to the power amplifier circuitry 40.

A user may interact with the mobile terminal 10 via the interface 28, which may include interface circuitry 44 associated with a microphone 46, a speaker 48, a keypad 50, and a display 52. The interface circuitry 44 typically includes analog-to-digital converters, digital-to-analog converters, amplifiers, and the like. Additionally, it may include a voice encoder/decoder, in which case it may communicate directly with the baseband processor 20.

The microphone 46 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 48 by the interface circuitry 44. The keypad 50 and display 52 enable the user to interact with the mobile terminal 10, input numbers to be dialed and address book information, or the like, as well as monitor call progress information.

While the present invention is well-suited for incorporation into a mobile terminal, such as the mobile terminal 10 just described, it should be noted that the present invention is well-suited for use in any wireless transmitter. Types of wireless transmitters include the transmitter section 14 of the mobile terminal 10, a wireless transmitter associated with a wireless LAN, and the like. As such, the present invention is not limited to a particular apparatus.

Figure 2:
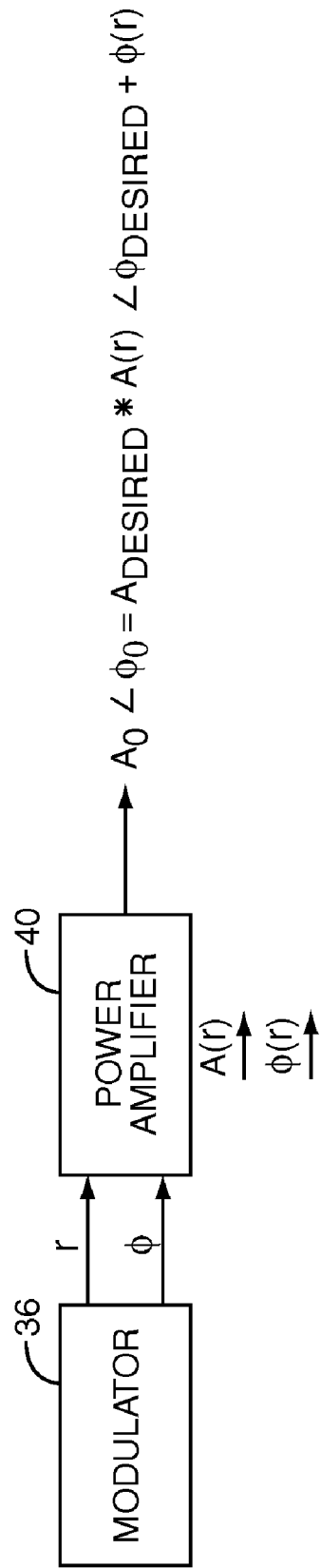
FIG. 2 illustrates AM to AM and AM to PM distortion of a typical power amplifier.

Historically, as illustrated in FIG. 2, the modulator 36 directed its output to the power amplifier circuitry 40. In an exemplary prior art embodiment, the modulator 36 included a rectangular-to-polar converter (not shown) and directed an amplitude signal (r) and a phase signal (φ) to the power amplifier circuitry 40. The amplitude signal (r) controlled the power supply voltage of the power amplifier circuitry 40, potentially replacing or including the power control circuitry 42, while the phase signal (φ) was amplified by the power amplifier circuitry 40 to create $A_{DESIRED} \angle \phi_{DESIRED}$. The output ($A_O \angle_O$) of the power amplifier circuitry 40 was corrupted by AM to PM distortion within the non-linear power amplifier circuitry 40, represented by φ(r), and AM to AM distortion, represented by A(r), resulting in an output signal of $A_{DESIRED} * A(r) \angle \phi_{DESIRED} + \phi(r)$.

The pre-distortion circuitry 38 (FIG. 1) of the present invention corrects the AM to AM and AM to PM distortion within the power amplifier circuitry 40 by preliminarily distorting the amplitude (r) and phase (φ) signals such that when they are amplified by the power amplifier circuitry 40, an amplitude pre-distortion element cancels the AM to AM distortion element A(r) and a phase pre-distortion element cancels the AM to PM distortion element φ(r).

Prior to discussing the details of the pre-distortion circuitry 38 of the present invention, it should be noted that in the past, polynomial pre-distortion was based on a polynomial for amplitude pre-distortion and a polynomial for phase pre-distortion. The two polynomials were used to distort a signal prior to amplification by the power amplifier circuitry 40 in order to offset the AM to AM and AM to PM distortion of the power amplifier circuitry 40. However, the two polynomials were often at least third order polynomials and are costly to implement. Further, the two polynomials may not effectively offset the AM to AM and AM to PM distortion of the power amplifier circuitry 40 at every power level of the power amplifier circuitry 40.

Figure 3A:
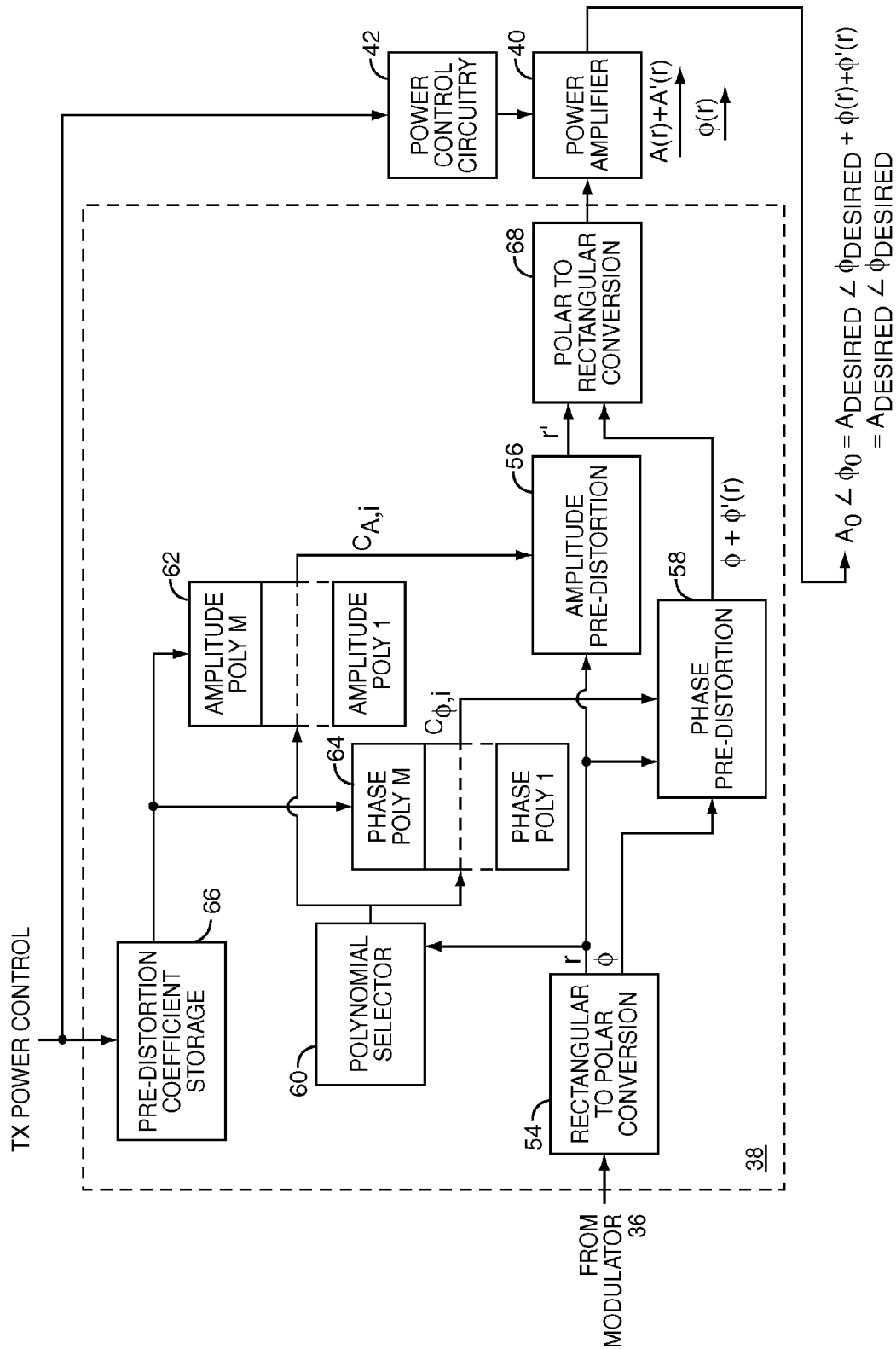
FIG. 3A is a detailed block diagram of the pre-distortion circuitry according to one embodiment of the present invention.

FIG. 3A illustrates the pre-distortion circuitry 38 according to one embodiment of the present invention. The pre-distortion circuitry 38 includes rectangular-to-polar conversion circuitry 54, amplitude pre-distortion circuitry 56, phase pre-distortion circuitry 58, polynomial selection circuitry 60, memories 62 and 64, pre-distortion coefficient storage circuitry 66, and polar-to-rectangular conversion circuitry 68. The rectangular-to-polar conversion circuitry 58 may optionally be part of the modulator 36. Further, the polar-to-rectangular conversion circuitry 58 is optional such that the power amplifier circuitry 40 receives a pre-distorted polar signal from the pre-distortion circuitry 38.

In general, the pre-distortion circuitry 38 operates to essentially cancel the AM to AM and AM to PM distortion of the power amplifier circuitry 40. More specifically, the rectangular-to-polar conversion circuitry 54 converts the modulated carrier signal from the modulator 36, which is a rectangular signal having an in-phase (I) and a quadrature phase (Q) component, into a polar signal having an amplitude component (r) and a phase component (φ). The amplitude component (r) is directed to each of the amplitude pre-distortion circuitry 56, the phase pre-distortion circuitry 58, and the polynomial selection circuitry 60.

The amplitude pre-distortion circuitry 56 operates to generate an amplitude compensation signal A'(r) and provides a pre-distorted amplitude component (r') of a pre-distorted polar signal. In one embodiment, the amplitude pre-distortion circuitry 56 adds the compensation signal A'(r) to the amplitude component (r) of the polar signal. In another embodiment, the amplitude pre-distortion circuitry 56 multiplies the compensation signal A'(r) and the amplitude component (r) of the polar signal. As described below in more detail, the compensation signal A'(r) is such that it essentially cancels the AM to AM distortion A(r) of the power amplifier circuitry 40. The phase pre-distortion circuitry 58 operates to generate a phase compensation signal φ'(r) and, in this embodiment, adds the compensation signal φ'(r) to the phase component (φ) of the polar signal to provide a phase component (φ+φ'(r)) of the pre-distorted polar signal. As described below in more detail, the compensation signal φ'(r) is essentially the additive inverse of the AM to PM distortion of the power amplifier circuitry 40.

The AM to AM distortion A(r) and the AM to PM distortion φ(r) change when a power level of the power amplifier circuitry 40 changes. Thus, in order to more accurately cancel the AM to AM distortion A(r) and the AM to PM distortion φ(r), the pre-distortion circuitry 38 of the present invention generates the compensation signals A'(r) and φ'(r) such that the compensation signals A'(r) and φ'(r) are dependant upon the power level of the power amplifier circuitry 40. Further, as commonly known, the AM to AM distortion A(r) and the AM to PM distortion φ(r) for the power amplifier are non-linear over a range of input voltages. Accordingly, if the compensation signals A'(r) and φ'(r) are each described as a single polynomial for each power level, the polynomial for each power level is typically third order or higher. Implementation of a third order polynomial is complex. However, if the range of input values of the power amplifier circuitry 40 is divided into a number of subset, then each of the compensation signals A'(r) and φ'(r) for each power level can each be described by a number of low-order polynomials each describing the compensation signal for one of the number of subsets of the input value range.

Thus, according to the present invention, the compensation signal A'(r) is described by at least two groups of multiple low-order polynomials, where each of the multiple polynomials in each of the groups is defined by a set of coefficients. Each of the groups of multiple low-order polynomials corresponds to one of the power levels of the power amplifier circuitry 40, and each of the multiple low-order polynomials describes the compensation signal A'(r) for a subset of the input value range of the power amplifier circuitry 40. Similarly, the compensation signal φ'(r) is described as at least two groups of multiple low-order polynomials, where each of the multiple polynomials in each of the groups is defined by a set of coefficients. Each of the groups of multiple low-order polynomials corresponds to one of the power levels of the power amplifier circuitry 40, and each of the multiple low-order polynomials describes the compensation signal φ'(r) for one of the subsets of the input range of the power amplifier circuitry 40.

In an exemplary embodiment, the power levels correspond to 2 dBm power steps in the output power of the power amplifier circuitry 40. This corresponds to the power steps defined in the European Telecommunications Standards Institute (ETSI) standards. Further, it should be noted that the input value range may be divided into any number of subsets. The greater the number of subsets, the lower the order to the multiple polynomials. If the number of subsets is sufficiently large, each of the multiple polynomials may be a straight line. However, it may be desirable to have a low number of subsets, such as two or three, in order to reduce the size of the memories 62 and 64 needed to store the sets of coefficients and to reduce the complexity of the pre-distortion circuitry 38.

It should also be noted that, for each power level, the coefficients for each polynomial for each subset of the input value range are determined such that there are no discontinuities in the compensation signal A'(r) or φ'(r). More specifically, end-points of the polynomials for each subset of the input value range are constrained such that the end-points of the polynomials in adjacent subsets are aligned. This may be accomplished in numerous ways. For example, the end-points of adjacent subsets may be aligned by examining the end-points of the adjacent subsets and offsetting each of the end-points to force alignment.

A set of coefficients for each polynomial in each group of multiple polynomials for both of the compensation signals A'(r) and φ'(r) are stored by the pre-distortion coefficient storage circuitry 66. The pre-distortion coefficient storage circuitry 66 may include software and hardware and may be programmable such that the coefficients can be programmed for a particular power amplifier circuitry 40 or such that the coefficients may be updated during operation. Based on the transmit power control signal (TX POWER CONTROL), the pre-distortion coefficient storage circuitry 66 provides coefficients for the group of multiple polynomials corresponding to the current power level for the compensation signal A'(r) to the memory 62 and provides coefficients for the group of multiple polynomials corresponding to the current power level for the compensation signal φ'(r) to the memory 64.

In operation, the amplitude component (r) of the polar signal is provided to each of the amplitude pre-distortion circuitry 56, the phase pre-distortion circuitry 58, and the polynomial selection circuitry 60. Based on the amplitude component (r) of the polar signal, the polynomial selection circuitry 60 generates a selection signal that selects a set of coefficients from the group of coefficients stored in each of the memories 62 and 64 to be sent to the amplitude and phase pre-distortion circuitries 56 and 58. The polynomial selection circuitry 60 generates the selection signal by determining the subset of the range of input values in which the value of the amplitude component (r) falls. Based on the selection signal, the memory 62 transfers the set of coefficients defining the polynomial describing the amplitude compensation signal A'(r) for the current power level and the current amplitude component (r) of the polar signal to the amplitude pre-distortion circuitry 56. Also based on the selection signal, the memory 64 transfers the set of coefficients defining the polynomial describing the phase compensation signal φ'(r) for the current power level and the current amplitude component (r) of the polar signal to the phase pre-distortion circuitry 58.

Once the amplitude pre-distortion circuitry 56 receives the set of coefficients defining the polynomial describing the compensation signal A'(r) for the current power level and the current amplitude component (r) of the polar signal, the amplitude pre-distortion circuitry 56 generates the amplitude compensation signal A'(r), which can be described by the following equation:

$$A'(r) = \sum_{i=0}^{N} C_{A,i}(r(t))^i,$$

where $C_{A,i}$ are the coefficients from the memory 62. As an example, if N=2, the equation expands to the following:

$$A'(r) = C_{A,0} + C_{A,1} r(t) + C_{A,2} (r(t))^2$$

where r(t) is the amplitude component (r) from the rectangular-to-polar converter 54. It is readily apparent that A'(r) has an offset term, a linear term, and a squared term. In an exemplary embodiment, the offset term $C_{A,0}$ and the coefficient for the linear term $C_{A,1}$ are zero. An offset term would act the same as increasing or decreasing the output power level. Since, in one embodiment, the power control circuitry 42 already addresses this, it may not be necessary to repeat the control here. Likewise, a linear term would only change the fundamental amplitude and not change the shape of the curve, so a linear term for the amplitude compensation signal A'(r) may not be needed.

When the exemplary embodiment A'(r) is combined with the amplitude component r(t) in the amplitude pre-distortion circuitry 56, the combined signal is:

$$r'(t) = r(t) + A'(r).$$

Thus, when $C_{A,0} = C_{A,1} = 0$, $$r'(t) = r(t) + C_{A,2}(r(t))^2$$

which converts easily to the following:

$$r'(t) = r(t) * [1 + C_{A,2}(r(t))]$$

Thus, the effect is to multiply the term r(t) by a correction factor, which in this example is $1 + C_{A,2}(r(t))$. This signal then passes through the power amplifier circuitry 40 with AM to AM distortion. This distortion, as previously noted, is A(r). The goal is thus to make the correction factor the multiplicative inverse of the AM to AM distortion such that, in this example, $A(r) * [1 + C_2(r(t))] = 1$. When this condition is true, the AM to AM distortion has been canceled.

Alternatively, if the amplitude pre-distortion circuitry 56 operated to multiply the amplitude component (r) and the amplitude compensation signal A'(r), then the compensation signal A'(r) could have a linear term and an offset term. In this embodiment, the pre-distorted amplitude component (r') is equal to r(t)*A'(r). The goal in this embodiment is to make the compensation signal A'(r) the multiplicative inverse of the AM to AM distortion such that A(r)*A'(r)=1 and the AM to AM distortion is canceled.

Similarly, once the phase pre-distortion circuitry 56 receives the coefficients of the polynomial describing the phase compensation signal φ'(r) for the current power level and the current amplitude component (r) of the polar signal, the phase pre-distortion circuitry 58 generates the phase compensation signal φ'(r), which can be described by the following equation:

$$\phi'(r) = \sum_{i=0}^{N} C_{\phi,i}(r(t))^i,$$

where $C_{\phi,i}$ are the coefficients from the memory 64. As an example, when N=2, the equation expands to the following:

$$\phi'(r) = C_{\phi,0} + C_{\phi,1} r(t) + C_{\phi,2}(r(t))^2.$$

It is readily apparent that φ'(r) of this example has an offset term, a linear term, and a quadratic term. When the phase pre-distortion circuitry 58 combines the compensation signal φ'(r) with r(t), the combined signal is the pre-distorted phase component (r(t)+φ'(r)). Thus, when this signal is converted to passes through the power amplifier circuitry 40, the compensation signal φ'(r) substantially cancels the AM to PM distortion. This distortion, as previously noted, is φ(r). The goal is thus to make the φ'(r) equal to the additive inverse of the AM to PM distortion φ(r) such that φ(r)+φ'(r)=0. When this condition is true, the AM to PM distortion has been canceled.

The pre-distorted amplitude component (r') and the pre-distorted phase component (φ+φ'(r)) form a pre-distorted polar transmit signal. In this embodiment, the pre-distorted polar signal is provided to the polar-to-rectangular conversion circuitry 68 where it is converted to a pre-distorted rectangular signal having an in-phase (I) and a quadrature phase (Q) component. The pre-distorted rectangular signal is provided to the power amplifier circuitry 40 for amplification. When the pre-distorted rectangular signal is provided to the power amplifier circuitry, the AM to AM distortion and the AM to PM distortion of the power amplifier circuitry 40 is essentially canceled, and the desired output signal $A_{DESIRED} \angle \phi_{DESIRED}$ is generated.

Figure 3B:
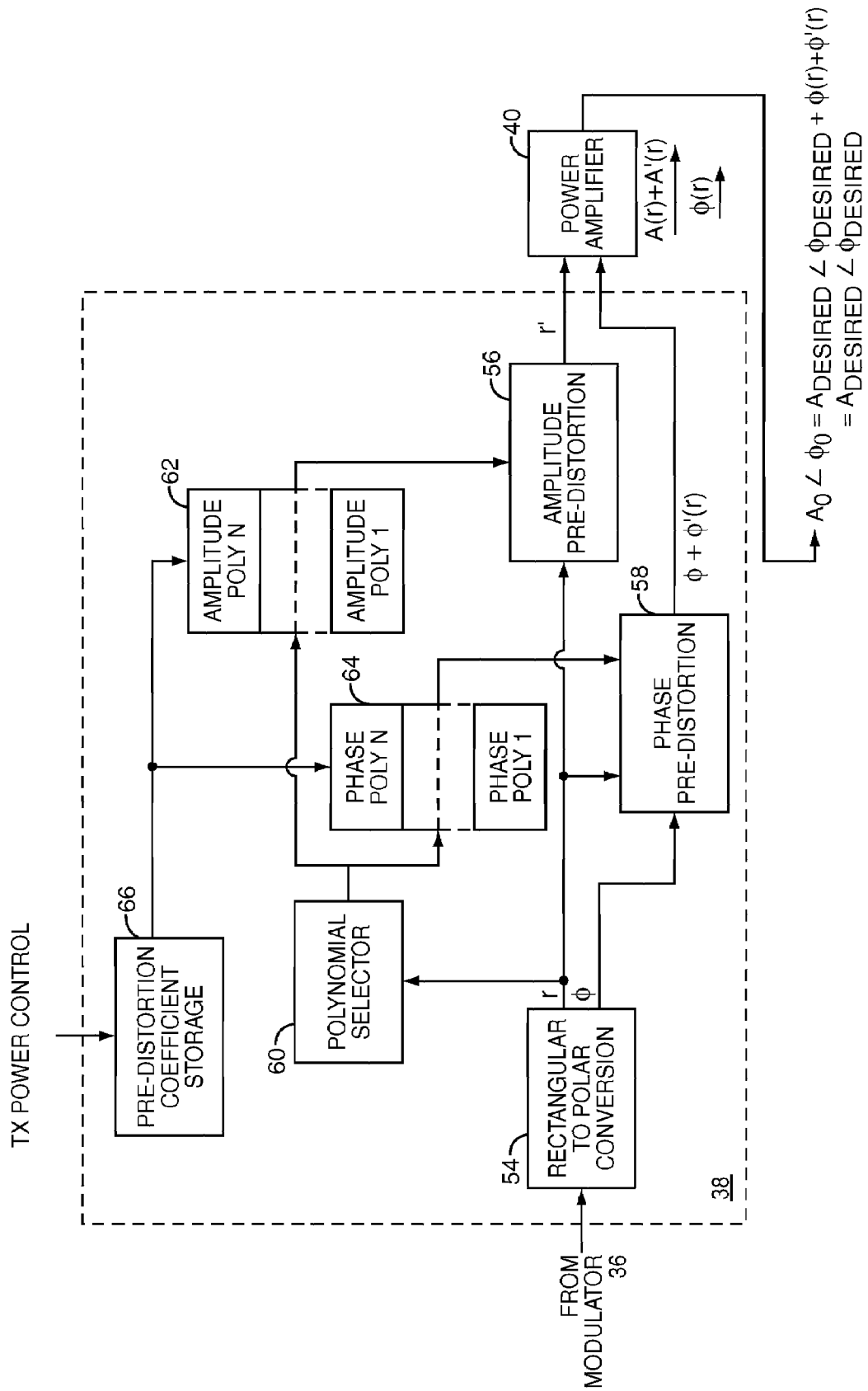
FIG. 3B is a detailed block diagram of the pre-distortion circuitry according to another embodiment of the present invention.

FIG. 3B illustrates the pre-distortion circuitry 38 according to another embodiment of the present invention. This embodiment of the pre-distortion circuitry operates essentially the same as the pre-distortion circuitry 38 of FIG. 3A. However, in this embodiment, the pre-distorted amplitude component (r') and the pre-distorted phase component ($\phi+\phi'(r)$) output by the amplitude pre-distortion circuitry 56 and the phase pre-distortion circuitry 58, respectively, are not converted to a rectangular signal by the polar-to-rectangular conversion circuitry 68 (FIG. 3A). Instead, the pre-distorted amplitude component (r') and the pre-distorted phase component ($\phi+\phi'$ (r)) form a pre-distorted polar signal that is provided to the power amplifier circuitry 40. In this embodiment, the power amplifier circuitry 40 is a polar modulation power amplifier and the amplitude component of the pre-distorted polar signal controls the output power of the power amplification circuitry 40, thereby modulating the phase component of the pre-distorted polar signal. However, the effect of the pre-distortion circuitry 38 is to essentially cancel the AM to AM and AM to PM distortion of the power amplifier circuitry 40. In another embodiment, the pre-distorted amplitude component (r') may be combined with the transmit power control signal (TX POWER CONTROL), and the combination provided to the power control circuitry 42 to control the supply voltage provided to the power amplifier circuitry 40.

The present invention provides substantial opportunity for variation without departing from the spirit or scope of the present invention. For example, although the pre-distortion circuitry 38 is described as having both the amplitude pre-distortion circuitry 56 and the phase pre-distortion circuitry 58, the pre-distortion circuitry 38 may have only the amplitude pre-distortion circuitry 56 or only the phase pre-distortion circuitry 58.

Those skilled in the art will recognize improvements and modifications to the preferred embodiments of the present invention. All such improvements and modifications are considered within the scope of the concepts disclosed herein and the claims that follow.

What is claimed is:

1. A wireless transmitter comprising:
   power amplifier circuitry having an AM to AM distortion characteristic for an input value range and adapted to amplify a pre-distorted transmit signal prior to transmission; and
   pre-distortion circuitry comprising amplitude pre-distortion circuitry adapted to:
   distort an amplitude component of a polar transmit signal based on a set of coefficients defining a polynomial describing an amplitude compensation signal that essentially cancels the AM to AM distortion of the power amplifier circuitry, thereby providing a pre-distorted amplitude component of the pre-distorted transmit signal;
   select the set of coefficients from a plurality of sets of coefficients defining a corresponding plurality of polynomials describing the amplitude compensation signal for each of at least two subsets of the input value range for each of at least two power levels of the power amplifier circuitry; and
   add the amplitude component of the polar transmit signal and the amplitude compensation signal, thereby distorting the amplitude component to provide the pre-distorted amplitude component of the pre-distorted transmit signal, such that the sum of the amplitude component and the amplitude compensation signal is essentially equivalent to a product of the amplitude component and a correction factor wherein the correction factor is essentially a multiplicative inverse of the AM to AM distortion of the power amplifier circuitry.

2. The wireless transmitter of claim 1 wherein the amplitude pre-distortion circuitry is further adapted to:
   select a group of the plurality of sets of coefficients that define multiple polynomials describing the amplitude compensation signal for one of the at least two power levels based on a power control signal;
   select the set of coefficients from the group of the plurality of sets of coefficients based on the amplitude component of the polar transmit signal; and
   generate the amplitude compensation signal based on the set of coefficients.

3. The wireless transmitter of claim 1 wherein the pre-distortion circuitry further comprises phase pre-distortion circuitry adapted to:
   distort a phase component of the polar transmit signal based on a second set of coefficients defining a polynomial describing a phase compensation signal that essentially cancels an AM to PM distortion of the power amplifier circuitry for the input value range, thereby providing a pre-distorted phase component of the pre-distorted transmit signal; and
   the second set of coefficients selected from a second plurality of sets of coefficients defining a corresponding second plurality of polynomials describing the phase compensation signal for each of the at least two subsets of the input value range for each of the at least two power levels of the power amplifier circuitry.

4. The wireless transmitter of claim 3 wherein the phase pre-distortion circuitry is further adapted to:
   select a group of the second plurality of sets of coefficients that define multiple polynomials describing the phase compensation signal for one of the at least two power levels based on a power control signal;
   select the second set of coefficients from the group of the second plurality of sets of coefficients based on the amplitude component of the polar transmit signal;
   generate the phase compensation signal based on the second set of coefficients; and
   combine the phase component of the polar transmit signal and the phase compensation signal, thereby distorting the phase component to provide the pre-distorted phase component of the pre-distorted transmit signal.

5. The wireless transmitter of claim 4 wherein the phase pre-distortion circuitry is further adapted to combine the phase component of the polar transmit signal and the phase compensation signal by adding the phase component of the polar transmit signal and the phase compensation signal wherein the second plurality of sets of coefficients define the phase compensation signal such that the phase compensation signal is essentially the additive inverse of the AM to PM distortion of the power amplifier circuitry.

6. The wireless transmitter of claim 1 wherein the plurality of sets of coefficients are programmable.

7. The wireless transmitter of claim 1 wherein the pre-distortion circuitry further comprises rectangular-to-polar conversion circuitry adapted to provide the polar transmit signal by converting a rectangular transmit signal into the polar transmit signal.

8. The wireless transmitter of claim 3 wherein the pre-distortion circuitry further comprises polar-to-rectangular conversion circuitry adapted to convert the pre-distorted amplitude components and the pre-distorted phase components into a rectangular pre-distorted signal and provide the rectangular pre-distorted signal to the power amplifier circuitry as the pre-distorted transmit signal.

9. The wireless transmitter of claim 3 wherein the pre-distorted transmit signal is a polar signal comprising the pre-distorted amplitude and phase components.

10. A wireless transmitter comprising:
power amplifier circuitry having an AM to PM distortion characteristic for an input value range and adapted to amplify a pre-distorted transmit signal prior to transmission; and
pre-distortion circuitry comprising phase pre-distortion circuitry adapted to:
distort a phase component of a polar transmit signal based on a set of coefficients defining a polynomial describing a phase compensation signal that essentially cancels the AM to PM distortion of the power amplifier circuitry, thereby providing a pre-distorted phase component of the pre-distorted transmit signal;
select the set of coefficients from a plurality of sets of coefficients defining a corresponding plurality of polynomials describing the phase compensation signal for each of at least two subsets of the input value range for each of at least two power levels of the power amplifier circuitry; and
add the phase component of the polar transmit signal and the phase compensation signal, thereby distorting the phase component to provide the pre-distorted phase component of the pre-distorted transmit signal wherein the plurality of sets of coefficients define the phase compensation signal such that the phase compensation signal is essentially the additive inverse of the AM to PM distortion of the power amplifier circuitry.

11. The wireless transmitter of claim 10 wherein the phase pre-distortion circuitry is further adapted to:
select a group of the plurality of sets of coefficients that define multiple polynomials describing the phase compensation signal for one of the at least two power levels based on a power control signal;
select the set of coefficients from the group of the plurality of sets of coefficients based on an amplitude component of the polar transmit signal; and
generate the phase compensation signal based on the set of coefficients.

12. The wireless transmitter of claim 10 wherein the pre-distortion circuitry further comprises amplitude pre-distortion circuitry adapted to:
distort an amplitude component of the polar transmit signal based on a second set of coefficients defining a polynomial describing a amplitude compensation signal that essentially cancels an AM to AM distortion of the power amplifier circuitry for the input value range, thereby providing a pre-distorted amplitude component of the pre-distorted transmit signal; and
the second set of coefficients selected from a second plurality of sets of coefficients defining a corresponding second plurality of polynomials describing the amplitude compensation signal for each of the at least two subsets of the input value range for each of the at least two power levels of the power amplifier circuitry.

13. The wireless transmitter of claim 12 wherein the amplitude pre-distortion circuitry is further adapted to:
select a group of the second plurality of sets of coefficients that define multiple polynomials describing the amplitude compensation signal for one of the at least two power levels based on a power control signal;
select the second set of coefficients from the group of the second plurality of sets of coefficients based on the amplitude component of the polar transmit signal;
generate the amplitude compensation signal based on the second set of coefficients; and
combine the amplitude component of the polar transmit signal and the amplitude compensation signal, thereby distorting the amplitude component to provide the pre-distorted amplitude component of the pre-distorted transmit signal.

14. The wireless transmitter of claim 13 wherein the amplitude pre-distortion circuitry is further adapted to combine the amplitude component of the polar transmit signal and the amplitude compensation signal by multiplying the amplitude component of the polar transmit signal and the amplitude compensation signal and wherein the second plurality of sets of coefficients define the amplitude compensation signal such that the amplitude compensation signal is essentially a multiplicative inverse of the AM to AM distortion of the power amplifier circuitry.

15. The wireless transmitter of claim 13 wherein the amplitude pre-distortion circuitry is further adapted to combine the amplitude component of the polar transmit signal and the amplitude compensation signal by adding the amplitude component of the polar transmit signal and the amplitude compensation signal.

16. The wireless transmitter of claim 15 wherein the second plurality of sets of coefficients define the amplitude compensation signal such that the sum of the amplitude component and the amplitude compensation signal is essentially equivalent to a product of the amplitude component and a correction factor wherein the correction factor is essentially the multiplicative inverse of the AM to AM distortion of the power amplifier circuitry.

17. The wireless transmitter of claim 12 wherein the pre-distortion circuitry further comprises polar-to-rectangular conversion circuitry adapted to convert the pre-distorted amplitude component and the pre-distorted phase components into a rectangular pre-distorted signal and provide the rectangular pre-distorted signal to the power amplifier circuitry as the pre-distorted transmit signal.

18. The wireless transmitter of claim 12 wherein the pre-distorted transmit signal is a polar signal comprising the pre-distorted amplitude and phase components.

19. The wireless transmitter of claim 10 wherein the plurality of sets of coefficients are programmable.

20. The wireless transmitter of claim 10 wherein the pre-distortion circuitry further comprises rectangular-to-polar conversion circuitry adapted to provide the polar transmit signal by converting a rectangular transmit signal into the polar transmit signal.

* * * * *